United States Patent
Arami et al.

[11] Patent Number: 5,938,850
[45] Date of Patent: Aug. 17, 1999

[54] SINGLE WAFER HEAT TREATMENT APPARATUS

[75] Inventors: Junichi Arami, Shinjuku-Ku; Hironori Yagi, Yokohama; Kazutsugu Aoki, Shiroyama-Machi, all of Japan

[73] Assignee: Tokyo Electron Limited, Tokyo-To, Japan

[21] Appl. No.: 08/689,035

[22] Filed: Jul. 30, 1996

[30] Foreign Application Priority Data

Aug. 4, 1995 [JP] Japan .................................. 7-219669

[51] Int. Cl.⁶ .................................................. C23C 16/00
[52] U.S. Cl. .......................... 118/715; 118/724; 118/725; 118/728
[58] Field of Search ................... 118/715, 724, 118/725, 728; 392/413

[56] References Cited

U.S. PATENT DOCUMENTS

| | | | |
|---|---|---|---|
| 5,252,132 | 10/1993 | Oda et al. ................................. | 118/715 |
| 5,332,442 | 7/1994 | Kubodera et al. ....................... | 118/725 |
| 5,474,612 | 12/1995 | Sato et al. ................................ | 118/728 |

FOREIGN PATENT DOCUMENTS

| | | |
|---|---|---|
| 59-147428 | 8/1984 | Japan . |
| 4-343418 | 11/1992 | Japan . |
| 6-208959 | 7/1994 | Japan . |

Primary Examiner—Bruce Breneman
Assistant Examiner—Alankar Modi
Attorney, Agent, or Firm—Smith, Gambrell & Russell, LLP; Beveridge, DeGrandi, Weilacher & Young Intellectual Property Group

[57] ABSTRACT

A single wafer heat treatment apparatus in which an object to be treated placed on a susceptor supported on a heat insulating member is heat-treated by indirectly heating the object to be treated by means of heating lamps disposed under the susceptor, characterized in that a gas entry preventive member for preventing process gas from being turned about the back surface of the susceptor is provided on a peripheral edge portion of the back surface of the susceptor. With this, process gas having entered the back surface of the susceptor is consumed by the adherence of a formed film to the surface of the gas entry preventive member.

11 Claims, 5 Drawing Sheets

SINGLE WAFER HEAT TREATMENT APPARATUS

BACKGROUND OF THE INVENTION

The present invention relates to a single wafer heat treatment apparatus for applying film-forming treatment to the surface of a semiconductor wafer or the like.

Generally, in the process of producing a semiconductor integrated circuit, a desired element is obtained by repeatedly carrying out film-forming and pattern etching or the like to a semiconductor wafer, a glass substrate and the like which are a material to be treated.

For example, the treatment apparatus for applying film-forming to the surface of a wafer includes a batch treatment apparatus capable of applying film-forming treatment to many wafers at once and a single wafer treatment apparatus for carrying out treatment wafer by wafer. Both the apparatuses are properly used depending on the kind of film-forming, the production quantity and the like.

As a single wafer treatment apparatus, there have been known a resistance heating treatment apparatus in which a susceptor for always holding wafers over the whole treatment period of a plurality of wafers, for example, and a lamp treatment apparatus capable of being increased in temperature at high speeds by heat from lamps. The lamp treatment apparatuses so far known are disclosed, for example, in Japanese Patent Laid-Open Publication No. 147428/1984, Japanese Patent Laid-Open Publication No. 343418/1992, Japanese Patent Laid-Open Publication No. 208959/1994, Japanese Patent Laid-Open Publication No. 3229/1991, Japanese Utility Model Laid-Open Publication No. 86935/1986, Japanese Utility Model Laid-Open Publication No. 121732/1992, Japanese Utility Model Laid-Open Publication No. 1996/1997, and Japanese Utility Model Laid-Open Publication No. 63044/1993.

Figure 6:
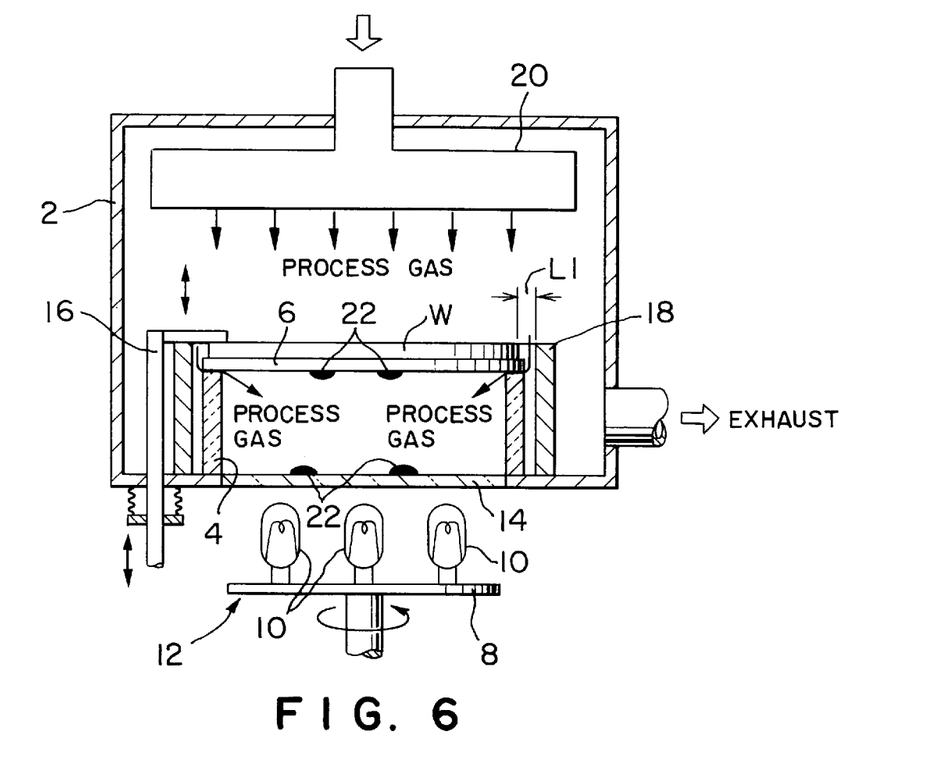
FIG. 6 is a longitudinal sectional view showing one example of a conventional single wafer heat treatment apparatus.

A general lamp treatment apparatus will be described hereinafter by way of example. As shown in FIG. 6, the treatment vessel 2 made of, for example, aluminum is interiorly provided with a heat insulating member 4 in the form of a ring formed of, for example, quartz, and a plate-like place rest (a susceptor) 6 made of, for example, carbon installed on the heat insulating member 4. A semiconductor wafer W is placed on the upper surface of the susceptor 6.

Heating means 12 having a number of heating lamps 10 mounted on a rotary table 8 is arranged under the treatment vessel 2. Radiating energy from the heating lamps 10 are irradiated on the back surface of the susceptor 6 through a transparent window 14 made of quartz at the bottom of the vessel to heat the susceptor 6 so as to indirectly heat the wafer W.

In the outer periphery of the susceptor 6 are provided, for example, a wafer lifter (not shown) which is vertically movable and a plurality of wafer clamps 16. Between the wafer lifter or the wafer clamps 16 is interposed a protective ring 18 made of, for example, aluminum for thermally protecting the lifter and clamps 16.

Further, a shower head portion 20 is installed, at the upper part of the susceptor 6, parallel with and opposed thereto to jet process gas such as silane gas into the treatment vessel 2.

The film-forming process is carried out by supplying the process gas from the head portion 20 to maintain a predetermined process pressure while maintaining the wafer w at a predetermined process temperature. Thereby, a film can be formed on the wafer surface by a predetermined material, for example, such as silicon, silicon oxide film or the like.

Incidentally, it is necessary for obtaining many semiconductor devices having a good electric property to form a film having a good property, and particularly it is necessary to apply a film having an even thickness on the wafer surface.

However, in the above-described conventional treatment apparatus, the wafer w is placed in face contact with the place surface of the susceptor 6, and the wafer W is heated by heat conduction from the susceptor 6. However, since the wafer W is repeatedly subjected to heat treatment many times in the previous process, the back surface of the wafer which appears to be flat is bent and deformed like waving as viewed microscopically. Accordingly, the back surface of the wafer is placed not in face contact with the place surface but in a point contact state. Accordingly, even if the temperature control of the susceptor 6 is carried out with high accuracy, the temperature distribution occurs in the wafer surface resulting therefrom, failing to sufficiently secure the in-plane evenness of a formed film. Particularly, since the deformation mode also differs every wafer, it is the present state that the point contact position also differs every wafer. This results in an unstable element, posing a problem in that the reproducibility of even formed film becomes worsened.

Further, the susceptor 6 shown in FIG. 6 need be placed without being secured to the heat insulating member 4 to allow a thermal expansion. Therefore, a partial clearance is created between the lower surface of the susceptor 6 and the heat insulating member 4 so that the process gas flows into the back surface of the susceptor 6 through the clearance as shown in FIG. 6, and the formed film 22 is adhered to the back surface of the susceptor 6 and the inner surface of the transparent window 14 which are in a high temperature state. Since the formed film 22 changes the permeability and the emissivity from the heating lamps 10, the heat efficiency lowers, the temperature distribution of the wafer occurs, the film thickness increases as the number of wafers to be treated increases, and the reproducibility of heat treatment lowers.

In this case, a thermocouple (not shown) is embedded every zone into the susceptor 6 for the temperature control. It is the present state that the position of the thermo-couple is locked while the adhesion of the formed film has a two dimensional extension, and only the thermo-couple is not enough to cope with the temperature control thereof.

In the apparatus shown in FIG. 6, the spacing L1 between the protective ring 18 at thermally the same level as the treatment vessel 2 and the circumferential portion of the susceptor 6 is necessary, but for the purpose of miniaturizing the apparatus, the spacing L1 is very narrow, for example, about a few mm. Therefore, even if the mounting position of the susceptor 6 is deviated by only about 0.5 mm, it receives an uneven thermal influence from the protective ring 18 externally thereof.

Figure 7:
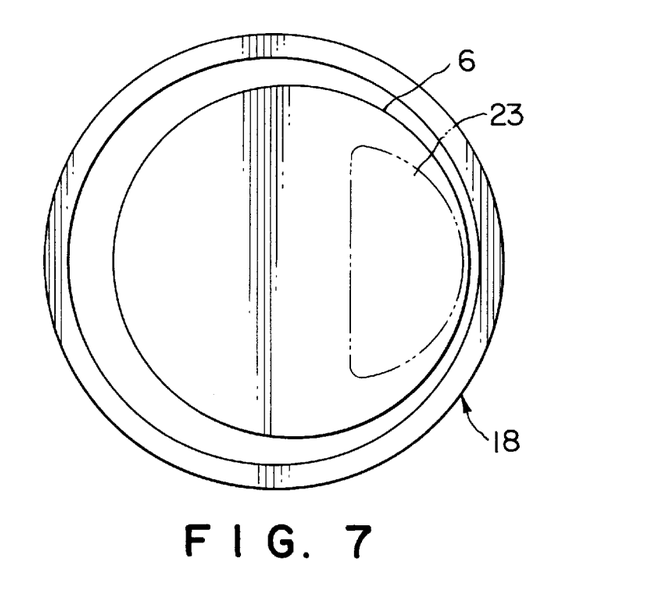
FIG. 7 is a plan view showing an unevenness degree of temperature distribution on the susceptor resulting from an error in assembly of the wafer susceptor of the conventional single wafer heat treatment apparatus.

As a result, the heat resistance between the peripheral edge portion of the susceptor 6 and the protective ring 18 is not even but uneven in the circumferential direction, and the temperature distribution is deviated as shown in FIG. 6, resulting in the occurrence of uneven temperature distribution. Area 23 surrounded by the chain line in FIG. 7 indicates an area whose temperature is lower than other portions. Such an uneven temperature distribution causes the in-plane evenness of the film formed on the wafer to lower.

The unevenness of the film thickness as described above poses a significant problem as the size of the wafer increases from 6 inches to 8 inches, and with the trend of higher density and higher fineness of IC, and thinner film.

SUMMARY OF THE INVENTION

The present invention has been achieved, paying attention to the problems noted above with respect to the conventional apparatus, in an attempt of effectively solving them. An object of the present invention is to provide a single wafer heat treatment apparatus capable of preventing process gas from turning about the back surface of the susceptor.

It is a further object of the present invention to provide a single wafer heat treatment apparatus for supporting a material to be treated merely by a peripheral edge portion thereof to remove a thermally unstable element.

It is another object of the present invention to provide a single wafer heat treatment apparatus for considerably reducing a thermal influence caused by an error in assembly of a susceptor.

The present invention provides a single wafer heat treatment apparatus in which a material to be treated placed on a susceptor supported on a heat insulating member is heat-treated by indirectly heating said material to be treated by means of heating lamps disposed under the susceptor, characterized in that a gas entry preventive member for preventing process gas from being turned about the back surface of said susceptor is provided on a peripheral edge portion of the back surface of said susceptor.

The present invention further provides a single wafer heat treatment apparatus in which a material to be treated placed on a susceptor supported on a heat insulating column (member) is heat-treated by indirectly heating said material to be treated by means of heating lamps disposed under the susceptor, characterized in that inert gas supply means for supplying an inert gas is provided in order to prevent process gas from turning about the back surface of said susceptor.

The present invention further provides a single wafer heat treatment apparatus for applying heat treatment to a material to be treated placed on a susceptor, characterized in that support convex portions are provided on said susceptor, which support convex portions come in direct contact with a peripheral edge portion of the back of said material to be treated to have the back surface of said material to be treated apart by a slight clearance from the upper surface of said susceptor.

Furthermore, the present invention provides a single after heat treatment apparatus in which a material to be treated placed on a susceptor provided interiorly of a treatment vessel is heat-treated by indirectly heating said material to be treated by means of heating lamps disposed thereunder, characterized in that a spacing between the side of said susceptor and the side wall of said treatment vessel or a member at thermally the same level as said side wall is set to a distance or more enough to suppress the thermal influence generated resulting from an error in assembly of said susceptor.

According to the present invention, for example, the cylindrical member having a predetermined length is provided on the peripheral edge portion of the back surface of the susceptor supported on the heat insulating column. Therefore, when the process gas moves into the back surface of the susceptor passing through the clearance between the heat insulating column and the cylindrical member to form a film on the surface of the cylindrical member whereby the process gas is consumed. Accordingly, it is possible to prevent the process gas from entering and turning around the back surface of the susceptor. Thus, it is possible to prevent the formed film from adhering to the back surface of the susceptor or the inner surface of the transparent window through which the heat rays of the heating lamps transmit and to prevent the occurrence of uneven temperature distribution and the reproducibility from being lowered.

Further, according to the present invention, an inert gas, for example, such as nitrogen gas, is positively supplied to the back surface of the susceptor by the inert gas supply means. Therefore, it is possible to prevent the process gas from turning around and entering the back surface of the susceptor passing through the clearance between the surface of the susceptor and the heat insulating column due to the pressure of the inert gas.

In this case, if the cylindrical member is provided in combination, it is possible to further suppress the entry of the process gas into the back surface of the susceptor.

Further, according to the present invention, the support convex portions are provided in the peripheral edge portion of the susceptor so that the peripheral edge portion of the material to be treated is supported by said portions. Therefore, the material to be treated is supported, without fail, on the susceptor side by the peripheral edge portion of the back surface thereof. As a result, the peripheral edge portion of the material to be treated is heated by the heat conduction and the heat radiation, and the portions other than the former are heated by the heat radiation to eliminate the unstable element such that no one knows whether or not which portion actually comes in contact with the surface of the susceptor due to the slight deformation of the material to be treated, to facilitate the temperature control, thereby not only enhancing the evenness of the in-plane temperature of the material to be treated but also enhancing the reproducibility.

Moreover, according to the present invention, the spacing between the side of the susceptor and the side wall of the treatment vessel or the member at thermally the same level as the former is set largely to some extent or more. Therefore, even if the susceptor is eccentrically mounted due to an error in assembly of the susceptor, it is possible to prevent the susceptor from subjecting to uneven thermal influence from the side wall or the aforesaid member. With this, it is possible to prevent the uneven temperature distribution from occurrence in the susceptor.

BRIEF DESCRIPTION OF THE DRAWINGS

The above and other aspects of the present invention are disclosed with respect to the drawings in which.

DETAILED DESCRIPTION OF THE PREFERRED EMBODIMENTS

An embodiment of the single wafer heat treatment apparatus according to the present invention will be described in detail hereinafter with reference to the accompanying drawings.

Figure 1:
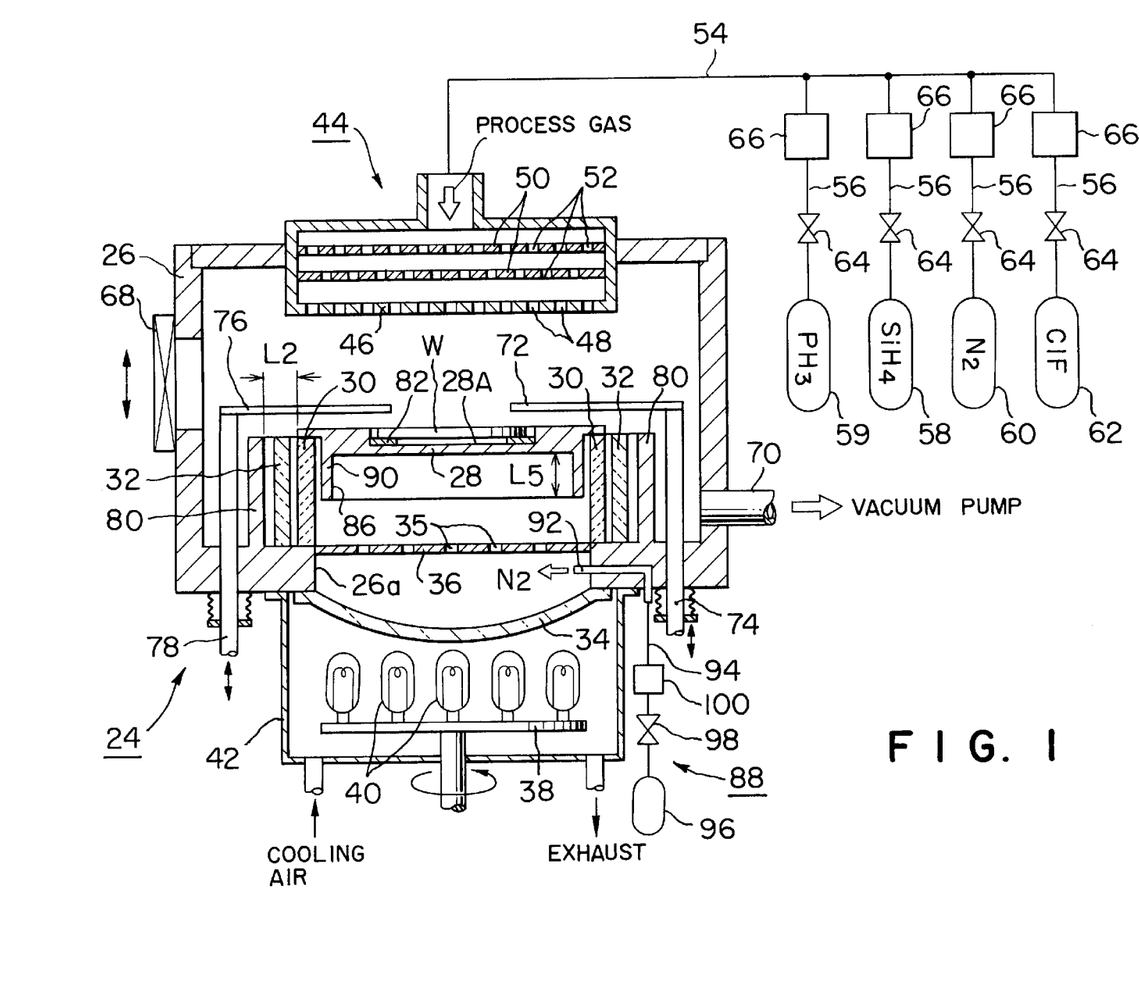
FIG. 1 is a longitudinal sectional view of a single wafer heat treatment apparatus according to the present invention.
Figure 2:
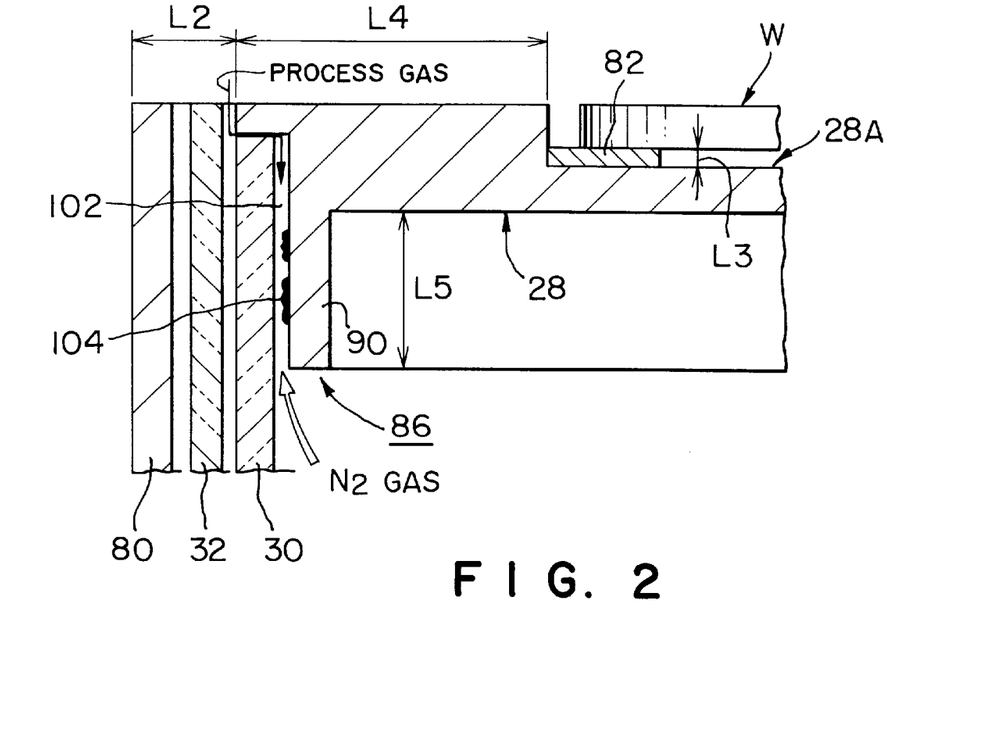
FIG. 2 is a fragmentary enlarged longitudinal sectional view of a peripheral edge portion of a wafer susceptor of the single wafer heat treatment apparatus shown in FIG. 1.
Figure 3:
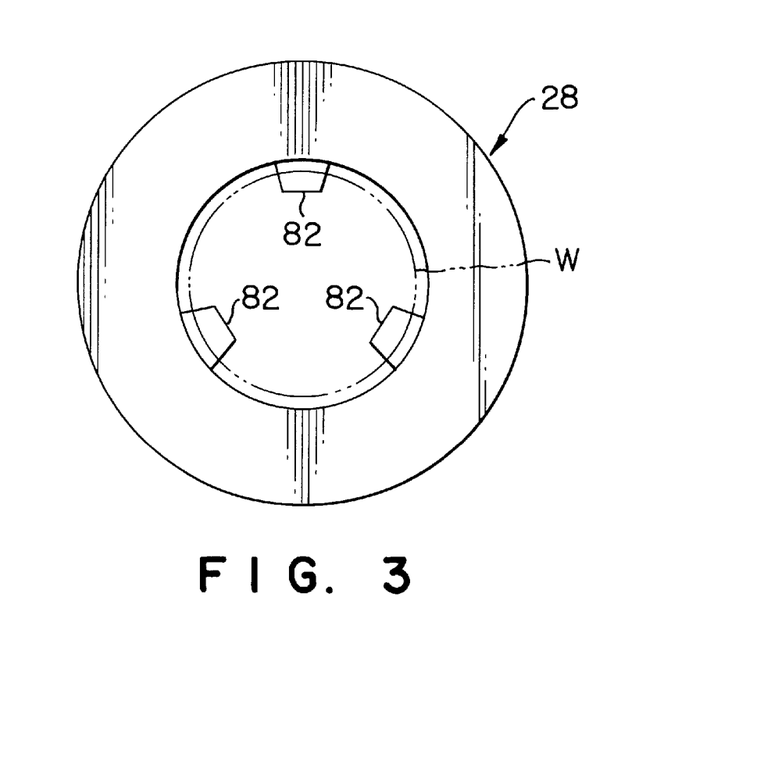
FIG. 3 is a plan view of the whole susceptor shown in FIG. 2.
Figure 4:
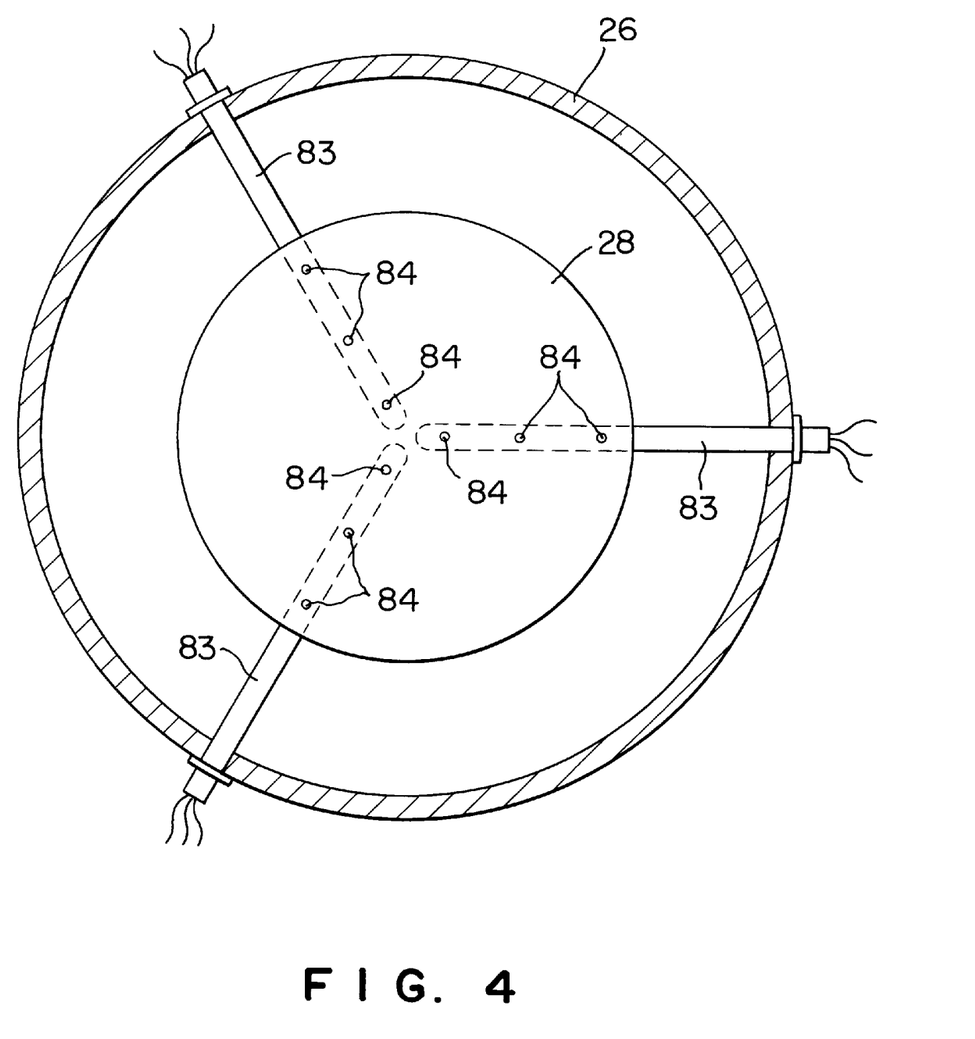
FIG. 4 is a plan view showing the arraying state of thermocouples provided on the susceptor shown in FIG. 2.

FIG. 1 is a sectional view of the single wafer heat treatment apparatus according to the present invention; FIG. 2 is an enlarged longitudinal sectional view showing the vicinity of the peripheral edge portion of the susceptor of the apparatus shown in FIG. 1; FIG. 3 is a plan view showing the susceptor shown in FIG. 1; and FIG. 4 is a view showing the arraying state of thermocouples provided on the susceptor.

In the present embodiment, the heat treatment apparatus will be described by way of an example of a single wafer CVD apparatus. The CVD apparatus 24 has a treatment vessel 26 formed of, for example, aluminum or the like and molded into a cylindrical or box-like configuration. Within the treatment vessel 26, there is installed a carbon-made susceptor 28 whose surface is coated with SiC and having a wall-thickness of about a few mm on a first heat insulating member 30 as a cylindrical heat insulating column made of, for example, quartz and having a thickness of scores of mm erected from the bottom detachably supporting the peripheral edge portion thereof (It is noted here that while a clearance between the peripheral edge portion on the heat insulating member 30 and the susceptor 28 is exaggeratedly depicted, it is normally minute). A semiconductor wafer W as a material to be treated is placed on the upper surface of the susceptor 28.

In the outer periphery of the first heat insulating member 30 is concentrically and circumferentially arranged a cylindrical second heat insulating member 32 formed of, for example, quartz having a thickness of scores of mm or so in a slightly spaced relation in order to secure a heat retaining property of the susceptor 28.

The treatment vessel 26 is formed at its thick bottom with a relatively large aperture 26a, externally of which is airtightly mounted a transparent window 34 made of a transparent material, for example, quartz, in the form of a downwardly convex shape. The reason why of having the transparent window 34 formed to have a downwardly convex shape as described is that the treatment chamber exposed to a vacuum atmosphere is made to be circular in section so as to increase the strength against the pressure applied toward the treatment chamber from the outside. Further, internally of the aperture 26a is provided a gas straightening sheet 36 in the form of a thin sheet likewise made of a transparent material, for example, quartz, having a number of gas holes 35.

Below the transparent window 34 there are installed a number of heating lamps 40 arranged on a rotary table 38 which is water-cooled. The heat rays from these lamps 40 transmit through the transparent window 34 and the gas straightening plate 36 to heat the susceptor 28 from the back surface thereof so that the wafer W is heated indirectly. While in the illustrated embodiment, the five heating lamps 40 are arranged, it is to be noted that in the case of a wafer of, for example, the 8-inch size, about 22 halogen lamps each having approximately 650 W of capacity are provided. All of the heating lamps 40 are covered by a casing 42, and since the interior of the casing 42 becomes a high temperature, for example, cooling air or cooling water is allowed to flow into a jacket of the casing 42 for the purpose of cooling it.

On the other hand, on the ceiling portion of the treatment vessel 26 is provided a shower head portion 44 which supplies process gas or the like into the treatment vessel so that the shower head portion 44 is opposed to be parallel with the susceptor 28. The shower head portion 44 is molded of, for example, aluminum, so that the entirety thereof is in the form of a circular box, and a gas jet surface 46 located on the lower surface thereof is formed with a number of gas jet orifices 48 each having a diameter of, for example, approximately a few mm. With this, the gases can be jetted downward.

The shower head portion 44 is interiorly provided with one or more (two in the illustrated embodiment) straightening plates 50, 50, each of which is formed with a number of diffusion holes 52. The diffusion holes 52 and the jet holes 48 are arranged in a zigzag fashion with one another, for example, in a vertical direction so that they are not disposed vertically and linearly so as to allow the gases which flow therein to be effectively straightened.

The shower head portion 44 is connected to process gas sources 58, 59, a carrier gas source 60 and a cleaning gas source 62 through a piping 54 and a plurality of branch pipes 56, each of the gas sources being controlled in its supply by a closing valve 64 provided on each of the branch pipes 56 and controlled in its flow rate by a mass flow controller 66. Although not limited, for example, silane ($SiH_4$) and phosphine ($PH_3$) as the process gas, nitrogen gas as the carrier gas, and $ClF_3$ gas as the cleaning gas are respectively used.

On the side wall of the treatment vessel 26 are provided with a gate valve 68 to be closed vertically when the wafer W is taken in and out, and an exhaust port 70 connected to a vacuum pump (not shown). The exhaust port 70 may be provided on the bottom of the treatment vessel 26 in order that the atmosphere within the treatment chamber is evenly exhausted from the circumferential portion of the susceptor 28. A cooling jacket (not shown) is provided on the bottom of the treatment vessel 26 to cool the latter.

It is necessary for taking the wafer W in and out of the treatment vessel 26 to vertically move the wafer W at the upper part of the place reset 28 or to lock the wafer W onto the susceptor 28. To this end, in the outer periphery of the susceptor 28, a wafer lifter 74 having a wafer lift arm 72 and a wafer clamp 78 having a wafer keep arm 76 are provided movably up and down extending through the bottom of the vessel 26.

In this case, since the wafer lifter 74 and the wafer clamp 78 are relatively weak to heat, a sufficient heat insulating property cannot be obtained only by the first and second heat insulating members 30 and 32 provided in the periphery of the susceptor 28. Therefore, a ring-like protective ring 80 is provided so as to be located between the outer second insulating member 32 and the wafer lifter 74 or the wafer clamp 78 to surround the susceptor 28 concentrically and circularly. The protective ring 80 is cut integral with the treatment vessel 26, for example. Accordingly, it assumes thermally substantially the same level as the side wall and the bottom of the treatment vessel 26 and is considerably lowered in temperature so as to thermally protect the wafer lifter 74 and the like.

In this case, as previously mentioned in the explanation of the conventional apparatus, if the spacing L2 between the protective ring 80 and the peripheral edge portion of the susceptor 28 is approximately 1.0 mm and an error in assembly of the susceptor 28 is, for example, approximately 0.5 mm, a difference between which is small, the thermal influence on the peripheral edge portion of the susceptor 28 has been uneven with a considerable deviation as the result of eccentricity caused by the error in assembly. In the present invention, however, the spacing L2 is set to the distance or more capable of suppressing the thermal influence generated resulting from the error in assembly of the susceptor 28.

More specifically, as shown in FIG. 2, the spacing L2 should be set to more than 10 folds of the error in assembly of the susceptor 28, that is, more than 5 mm, preferably, approximately 10 mm. In this case, when the spacing L2 is excessively large, the heat treatment apparatus is disadvantageously increased in size more than as needed, and in case of a 8-inch wafer, for example, the upper limit thereof is approximately 30 mm. The gap between the side of the wafer and the side wall of a place surface 28A is set to, for example, approximately 0.1 to 0.4 mm.

As described above, the spacing L2 between the susceptor 28 and the protective ring 80 provided externally thereof is intentionally set largely to some extent whereby even if the susceptor 28 is installed slightly eccentrically resulting from an error in assembly, it is possible to prevent the occurrence of the thermally adverse influence.

When by the heat treatment repeatedly applied to the wafer W, the wafer is slightly flexed and deformed to come into not face contact but into multi-point contact with the place surface, a temperature control is difficult to generate a relatively large temperature distribution in the wafer. In the present invention, however, it is configured to prevent this that only the peripheral edge portion of the wafer back surface provides the contact support.

That is, a central major portion of the upper surface of the susceptor 28 is depressed into a recess to form the place surface 28A which is slightly larger in diameter than that of the wafer. As shown in FIG. 2, support convex portions 82 having a thickness L3 of approximately 1 mm are arranged, in the peripheral edge portion of the place surface 28A, at a few locations (for example, three locations) equidistantly along the periphery thereof, so that the support convex portions 82 come into direct contact with the peripheral edge portion of the back surface of the wafer W to support (pin point support) the latter. In the embodiments shown in FIG. 2 and FIG. 3, three support convex portions 82 are provided, but more than 4 support convex portions 82 may be provided in order to support the wafer W in a stabilized manner or all the support convex portions 82 may be connected so as to have a ring configuration. In the case where three support convex portions 82 are provided as in the illustration, all the support convex portions 82 come into contact with the back surface of the wafer without fail whereby the unstable elements such that no one knows which part of the back surface of the wafer comes in contact with the place surface can be positively eliminated. The support convex portions 82 may be formed integral with the susceptor 28.

With the arrangement as described above, the wafer portions other than the support convex portions 82 are heated by radiant heat from the susceptor 28, and the wafer portions corresponding to the support convex portions 82 are heated by heat conduction and radiant heat.

When the thickness L3 of the support convex portion 82 is excessively small, even the portions other than the support convex portions 82 are brought into contact with the place surface by deformation of the wafer, whereas when the thickness L3 is excessively large, they are excessively distanced from the place surface to deteriorate the heat efficiency, both of which are not preferable. The proper thickness L3 is in the range from approximately 0.2 mm to approximately 1.5 mm, particularly preferably, approximately 1.0 mm.

Further, the depth of the depressed place surface 28A is set to a depth so that when the wafer W is placed, the upper surface of the wafer is substantially in the same level as that of the upper surface of the peripheral edge portion of the susceptor 18 so as not to disturb a gas flow when process gas is supplied.

The first and second heat insulating members 30 and 32 are provided in the outer periphery of the susceptor 28, but the radiating quantity in the peripheral edge portion of the susceptor 28 increases as compared with that in the center portion thereof. So, the diameter of the susceptor 28 is not set to substantially the same as that of the wafer W but for example, the susceptor 28 is set larger than the wafer W by the length L4 of the shoulder of the susceptor 28 in the radial direction of the susceptor 28 and the length of a slight gap between the inner end of said shoulder and the outer periphery of the wafer to increase a heat ray receiving area in the peripheral edge portion of the wafer W so as to receive a large quantity of heat, thereby compensating for temperature of the peripheral edge portion of the susceptor 28 in which the radiating quantity tends to increase. The aforesaid length L4 is set, for example, in the case of the 8-inch wafer, to approximately 80 to 100 mm, depending on the wafer size.

In the case where a temperature control for the susceptor 28 takes place, it is expected that the temperature thereof differs according to the distance from the center of the susceptor 28. As shown in FIG. 4, three thermocouple rods 83 are detachably inserted, in the radial direction, into the susceptor 28 at intervals of 120 degrees, each thermocouple rod 83 having a plurality of (three in the illustration) thermo-couples 84 embedded at different positions in the radial direction. The outputs of the heating lamps 40 shown in FIG. 1 are controlled every zone on the basis of the detected valve of each thermocouple 84 to enable the temperature control every zone of the susceptor 28.

Further, as shown in FIG. 2, both the first heat insulating member 30 and the susceptor 28 cannot be provided in a mutually secured manner since it is necessary to allow thermal deformation thereof. Therefore, there is a tendency that the process gas moves into a space on the back surface side of the susceptor 28 passing through the slight clearance therebetween to form a film and the emissivity or the like gradually changes. In the present invention, therefore, two measures are taken to prevent this.

The first measure shown in FIG. 1 is that a gas entry preventive member 86 is provided on the back surface of the susceptor 28, and the second measure is that an inert gas supply means 88 is provided in the space on the back surface side of the susceptor 28.

First, as shown in FIG. 2, the gas entry preventive member 86 is composed of a cylindrical member 90 provided on the peripheral edge portion on the back surface side of the susceptor 28, and a slight clearance 102 is formed between the member 90 and the first heat insulating member 30 disposed externally thereof. This cylindrical member 90 can be formed of carbon or quartz, etc. which is the same material as that of the susceptor 28. With this arrangement, when the process gas is intended to enter through the slight clearance 102 between the first heat insulating member 30 and the cylindrical gas entry preventive member 86, a film is formed on the wall surfaces being heated of them and the process gas is consumed halfway and trapped.

When the length (height) L5 of the cylindrical member 90 is excessively short, the trap effect cannot be exhibited sufficiently whereas when the length L5 is excessively long, the radiating quantity increases to lower the heat efficiency or to fail to take balance. Accordingly, the length of the cylindrical member 90 is preferably, for example, in the range from approximately 15 mm to approximately 30 mm, depending on the size of the susceptor 28. Preferably, the length L5 is set to approximately 20 mm with respect to approximately 300 mm of the diameter of the susceptor 28.

On the other hand, as shown in FIG. 1, the inert gas supply means 88 has a jet nozzle 92 provided from the bottom of the treatment vessel 26 face to the inside of the transparent window 34, the jet nozzle 92 being connected to an inert gas source 96 for storing inert gases such as $N_2$ through a pipe 94. In the midst of the pipe 4 are provided a closing valve 98 and a mass flow controller 100 for controlling the flow rate. By supplying the $N_2$ gas toward the back surface of the susceptor 28 while controlling the flow rate thereby, a reverse pressure is applied to the clearance 102 between the susceptor 28 and the first heat insulating member 30 to prevent the process gas from entering. It is noted that at least either or both the gas entry preventive member 86 and the inert gas supply means 88 may be provided.

The operation of the embodiment of the single wafer treatment apparatus constructed as described above will be explained hereinafter.

First, as shown in FIG. 1, the untreated semiconductor wafer W being carried from a load lock chamber (not shown) is taken into the treatment vessel 26 through an aperture of the gate valve 68, is placed at a predetermined position on the susceptor 28 which is increased in advance to or below a process temperature by the heating lamps 40 by lifting the wafer lifter 74, and is secured to the susceptor 28 by the wafer clamp 78.

Next, the nitrogen gas ($N_2$) is supplied from the shower head portion 44, and the nitrogen gas is supplied to the space on the back surface side of the susceptor 28 from the inert gas supply means 88 under the susceptor 28 simultaneously therewith in the case where the susceptor 28 is secured as described later and after the supply of the nitrogen gas from the shower head portion 44 to prevent a leviation of the susceptor 28 in the case where the susceptor 28 is merely placed on the heat insulating member 30 as in the illustration to maintain a predetermined process pressure, for example, about 5 Torr while evacuating the treatment chamber. The $N_2$ gas in the space on the back surface of the susceptor 28 gradually escapes toward the treatment chamber through the clearance 102 between the susceptor 28 and the first heat insulating member 30 and exhausts out of the exhaust port 70 by means of a vacuum pump.

Next, the output of the heating lamps 40 is increased to increase the wafer W in temperature to a predetermined process temperature, for example, 640° C. to stabilize it, after which the process gas, that is, silane gas and phosphine gas are supplied in their predetermined quantity while reducing the supply of the $N_2$ gas from the shower head portion 44 to start formation of a lindope silicon film onto the wafer W.

Upon completion of the operation of forming a film after carrying out the film forming process to the wafer W for a predetermined period of time, the wafer W is taken out of the treatment chamber by the operation that is the reverse of the former. That is, the supply of the nitrogen gas is continued while stopping the supply of the process gas to substitute the atmosphere in the treatment chamber by the nitrogen gas, and at the same time, the output of the heating lamps 40 is also lowered to lower the temperature of the wafer down to a delivery temperature, for example, approximately 500° C.

Simultaneously therewith, for the purpose of preventing the susceptor 28 from being levitated, the mass flow controller 100 of the inert gas supply means 88 is restricted to reduce the quantity of nitrogen gas being supplied to the back surface of the susceptor 28, and subsequently also reduce the supply quantity of the nitrogen gas being supplied from the shower head portion 44. Then, the supply of the nitrogen gas from the inert gas supply means 88 is stopped, and subsequently the supply of nitrogen gas from the shower head portion 44 is stopped. In the case where the susceptor 28 is secured, no possible levitation as described occurs, and the reduction and stop of the supply of nitrogen gas from the shower head portion 44 and the inert gas supply means 88 may be simultaneously carried out.

When the pressure in the treatment chamber becomes the same as or slightly lower than the pressure of the load lock chamber adjacent thereto, the supply of nitrogen gas is stopped, and the gate valve 68 is opened to take out only the treated wafer W whereas the untreated wafer is taken in for carrying out the operation similar to that described above. The relationship of pressure between the interior of the treatment chamber and the interior of the load lock chamber is made as desired, to thereby prevent harmful gasses from flowing into the load lock chamber from the treatment chamber when the gate valve 68 is opened.

During the processing of forming a film on the wafer W, as shown in FIG. 2, there is a tendency that the process gas such as silane gas is moved into the space on the back surface side of the susceptor 28 passing through the clearance 102 between the susceptor 28 and the first heat insulating member 30. In the present embodiment, since the gas entry preventive member 86 composed of the cylindrical member 90 is provided on the back surface side of the susceptor 28, the film 104 is formed on the portion which is in a high temperature state when the process gas flows into the clearance 102 formed between the inner peripheral surface of the first heat insulating member 30 and the outer peripheral surface of the preventive member 86 so that the process gas becomes consumed, as a result of which it is possible to prevent the process gas from entering the space on the back surface side of the susceptor 28.

Simultaneously therewith, the nitrogen gas is supplied to the space on the back surface of the susceptor 28 from the inert gas supply means 88, as shown in FIGS. 1 and 2, so that the space is in a pressurized condition as compared with the inside of the treatment chamber. Therefore, the process gas having flown into the clearance 102 is pushed back by the nitrogen gas in a pressurized condition to prevent if form entering.

At least either the gas entry preventive means 86 or the inert gas supply means 88 may be provided, but both means can be used in combination to further positively prevent the process gas from entering.

Accordingly, according to the present invention, it is possible to substantially positively prevent the formed film which causes a variation in emissivity or the like from adhering to the back surface of the susceptor 28, the inner surface of the transparent window 34 and the surface of the gas straightening plate 36. As a result, it is possible to suppress the occurrence of the uneven temperature distribution in the susceptor 28 to make the in-plane temperature uneven or the variation in thermal condition every wafer even the number of wafers to be treated increases, and after all, it is possible to considerably enhance the reproducibility of treatment.

As a carrier gas, a nitrogen gas instead of a hydrogen gas which is smaller in diffusion coefficient than the latter is used whereby the diffusion of the raw gas is suppressed, and the flowing thereof into the space on the back surface side of the susceptor 28 can be further suppressed.

In this case, the gas holes 35 of the gas straightening plate 36 are disposed, for example, in the form of parallel crosses or concentrically circularly so that the gas flow rate is in in-plane even. Therefore, the $N_2$ gases supplied from the inert gas supply means 88 pass through the gas holes 35 of the gas straightening plate 36 whereby the gases are evenly supplied to the back surface of the susceptor 28.

As a result, the process gas entry preventive effect is evenly extended over the whole clearance 102 between the susceptor 28 and the heat insulating member 30. Further, since the heat transfer between the susceptor 28 and the $N_2$ gas is evenly effected, the $N_2$ gas does not impair the in-plane evenness of the temperature of the wafer W.

The peripheral edge portion of the back surface of the wafer W is supported by the direct contact with the three support convex portions 82 arranged on the peripheral edge portion of the susceptor 28A, and the wafer portions other than the former are in the state levitated by, for example, about 1 mm from the place surface 28A. Accordingly, the wafer W in the support convex portions 82 is heated by the heat conduction and the heat radiation, and the portions other than the former are heated merely by the heat radiation.

The mode of supporting the wafer as described above remains the same even if the wafer W is slightly thermally deformed. Accordingly, in the case of the conventional apparatus, the temperature control with high accuracy has been difficult since there was always present the unstable element which part of the back surface of the wafer comes in point-contact with the place surface. In the present invention, however, the support convex portions 82 are provided as described above, and as a result, the contact portion of the back surface of the wafer can be always specified, and the unstable element as described above can be eliminated. Accordingly, the temperature control into which is incorporated thermal unbalance resulting from the contact of only the peripheral edge portion of the wafer is carried out every zone by the controllable heating lamps 40 to thereby enable the temperature control with high accuracy of the susceptor. Accordingly, it is possible to eliminate an uneven temperature distribution of the susceptor 28 which has been experienced in the conventional apparatus.

In this case, the quantity of heat supplied to the peripheral edge portion of the back surface of the susceptor which tends to increase the heating radiating quantity is increased by increasing a light receiving area of the peripheral edge portion of the susceptor or by increasing the outputs of the corresponding heating lamps 40 to thereby compensate for heat, thus enabling the elimination of uneven temperature distribution of the susceptor 28.

Since the peripheral edge portion of the susceptor 28 is close to the side wall of the treatment vessel 26 as compared with the center side thereof, even if the first and second heat insulating members 30 and 32 are provided therebetween, the heat radiating quantity tends to increase to lower the temperature. Thus, in the present embodiment, the diameter of the place surface 28A of the susceptor 28 is made considerably larger than that of the wafer W, for example, the radial length is made large by the length L4 of the shoulder of the susceptor 28 and the length of the slight space between the inner end of said shoulder and the outer periphery of the wafer. Therefore, the light receiving surface in the peripheral edge portion of the susceptor 28 is increased by that portion so as to receive a large quantity of thermal energy from the lamps 40. That is, the large quantity of thermal energy is received here as much as the heat radiating quantity of the peripheral edge portion of the susceptor 28.

In this case, when the susceptor 28 is in an in-plane uniformly heated state, the temperature of the peripheral edge portion of the wafer W in which the heat radiating quantity is large lowers. Therefore, the temperature of the peripheral edge portion of the susceptor 28 is slightly increased over that of the center portion thereof to provide the temperature distribution whereby the evenness of the in-plane temperature of the wafer w can be secured.

As described above, the temperature of the peripheral edge portion of the susceptor 28 in which the heat radiating quantity is large is compensated for whereby the evenness of the in-plane temperature of the wafer W can be considerably enhanced.

Further, in assembling the susceptor 28 and the first heat insulating member 30, an occurrence of an error in assembly cannot be avoided. In this case, in the conventional apparatus, since a portion between the susceptor 28 and the side wall of the vessel 26 as a cold wall or the protective ring 80 which is thermally at the same level as the former is excessively narrowed, when a slight deviation caused by an error in assembly of the susceptor 28 merely occurs, the susceptor 28 is disadvantageously thermally unevenly affected. However, in the case of the present invention, the distance L2 between the protective ring 80 which is thermally at the same level as the side wall of the vessel 26 and the susceptor 28 is set to a large distance, for example, about 10 mm, such that even if an error in assembly of the susceptor 28 should occur, the thermal influence received by the susceptor 28 is rarely varied, and therefore, the susceptor 28 is free from an uneven temperature distribution. For example, in the conventional apparatus, when a clearance between the susceptor 28 and the protective ring 80 is narrowly set to about 1.0 mm and an error in assembly is then 5.0 mm at its maximum, one clearance in a diametral direction of the susceptor 28 is 1.5 mm in width while the other clearance is 0.5 mm in width. Therefore, the thermal influence received by the protective ring 80 is very unbalanced between both the ends, resulting in the uneven temperature distribution as mentioned above.

On the other hand, in the present invention, when a clearance between the susceptor 28 and the protective ring 80 is widely set to about 10.0 mm, even if an error in assembly of 0.5 mm, one clearance in a diametral direction of the susceptor 28 is 10.5 mm in width while the other clearance is 9.5 mm in width. Therefore, the rate of variation of both the clearances with respect to the error in assembly is so minute that can be ignored. Accordingly, the thermal influence received by the protective ring 80 at both the ends of the susceptor 28 is rarely varied, and the even temperature distribution of the susceptor 28 can be maintained. Further since the stability of the temperature distribution at the susceptor 28 can be secured without being affected by the error in assembly as mentioned above, it is possible to enhance the reproducibility of the process of forming a film on the wafer W.

In the above-described embodiment, the susceptor 28 is merely placed on the upper end of the first heat insulating member 30, and when the nitrogen gas is, for example, vigorously flown into the space on the back surface side of the susceptor 28 by the inert gas supply means 88, the susceptor 28 levitates for a moment to cause the generation of particles or the like.

Figure 5:
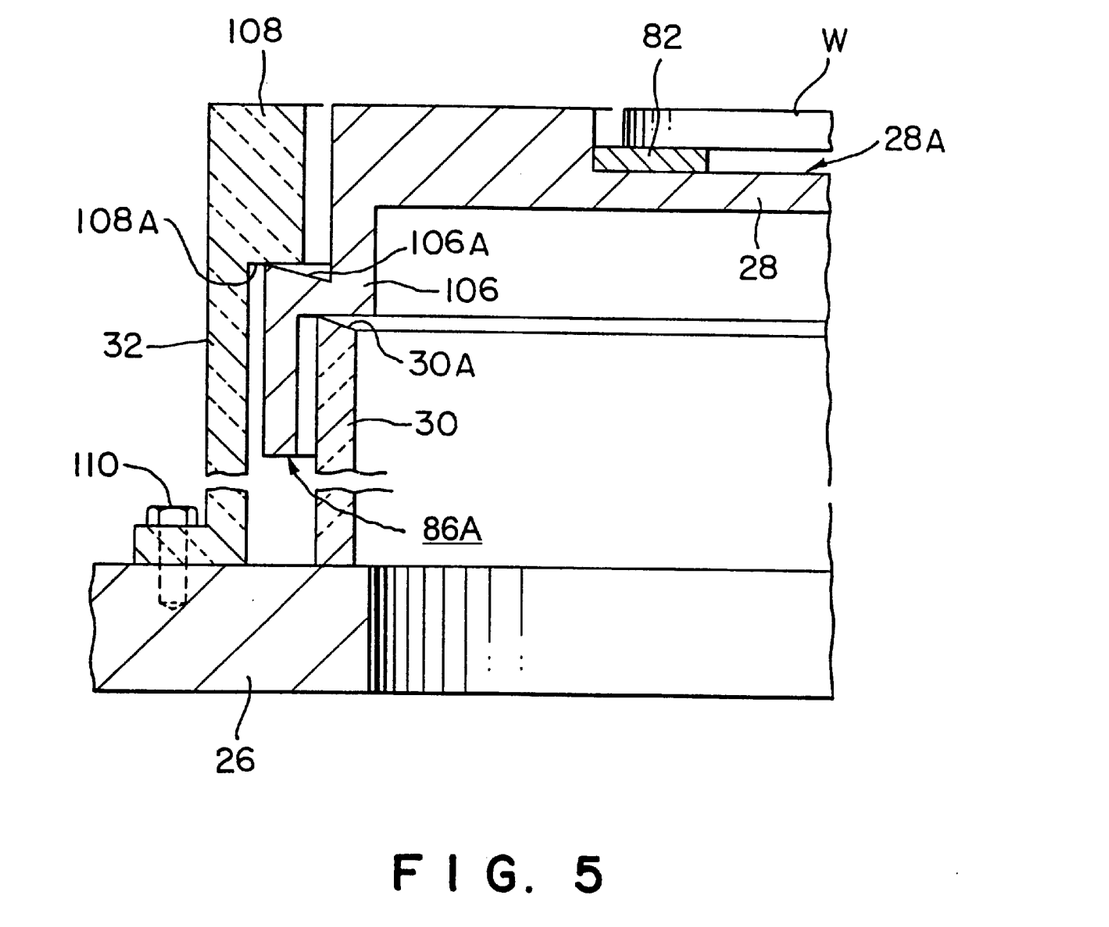
FIG. 5 is a fragmentary enlarged longitudinal sectional view of a peripheral edge portion of a modified example of the wafer susceptor of the single wafer heat treatment apparatus shown in FIG. 1.

To prevent this, the susceptor 28 can be locked as shown in FIG. 5. That is, an outwardly bent shoulder 106 is provided halfway of the gas entry preventive member 86A provided on the peripheral edge portion of the back surface of the susceptor 28, and an upper end 30A of the first heat insulating member 30 is brought into contact with the lower surface of the shoulder 16 and supported.

The second heat insulating member 32 is provided at its upper portion with an engaging convex portion 108 in the shape of Z in section extending toward the center of the susceptor, and a lower surface 108A of the engaging convex portion 108 is brought into contact with an upper surface 106A of the shoulder 106 and the lower end of the second heat insulating member 32 is mounted on the bottom of the vessel 26 by means of a bolt 110 or the like to thereby lock the susceptor 28 in such a manner that the latter is not levitated. In this case, the upper end 30A of the first heat insulating member 30 and the upper surface 106A of the shoulder 106 are not flat but are respectively tapered whose section is an edge at an acute angle, which comes in linear contact with the mating member not in face contact. Thereby, the radiating heat quantity conducted from the susceptor 28 toward the heat insulating members 30 and 32 can be suppressed so as to enhance a heat retaining property.

While in the above-described embodiment, silane gas or the like as a raw gas and a nitrogen gas as a carrier gas are used, the gases are not limited thereto. For example, as a raw gas, disilane gas and other gases can be used, and as a carrier gas, other inert gases, for example, such as argon gas, helium gas and the like can be used.

While in the present invention, a semiconductor wafer as a material to be treated has been described as an example, the material is not limited thereto but a glass substrate, a high molecular substrate and the like can be also used.

What is claimed is:

1. A single wafer heat treatment apparatus in which an object to be treated placed on a susceptor supported on a heat insulating member is heat-treated by indirectly heating said object to be treated by means of heating lamps disposed under said susceptor, said apparatus comprising:
   a gas entry preventive member for preventing process gas from being turned about a back surface of said susceptor, said gas entry preventive member being provided on a peripheral edge portion of said back surface of said susceptor, and being concentrically arranged externally of said heat insulating member to form a slight clearance therebetween; and
   inert gas supply means for supplying an inert gas behind said susceptor in order to prevent process gas from turning about said back surface of said susceptor.

2. The single wafer heat treatment apparatus according to claim 1, wherein said gas entry preventive member comprises a circular member having a predetermined length formed along said peripheral edge portion.

3. A single wafer heat treatment apparatus according to claim 1, further comprising support convex portions on said susceptor, said support convex portions coming into direct contact with a peripheral edge portion of the back of said object to be treated to space the back surface of said object to be treated apart by a slight clearance from the upper surface of said susceptor.

4. The single wafer heat treatment apparatus according to claim 3, wherein said support convex portions are arranged in plural number in a circumferential direction of said susceptor.

5. A single wafer heat treatment apparatus according to claim 1, wherein the side of said susceptor and a side wall of said treatment vessel or a member at thermally the same level as said side wall are spaced apart by a distance so as to suppress thermal influence resulting from error in assembly of said susceptor.

6. The single wafer heat treatment apparatus according to claim 5, wherein said distance to suppress said thermal influence is 10 folds or more of said error in assembly.

7. The single wafer heat treatment apparatus according to claim 5, wherein said member at thermally the same level as said side wall comprises a protective ring provided in the outer periphery of said susceptor.

8. A single wafer heat treatment apparatus in which an object to be treated placed on a susceptor is heat-treated by indirectly heating said object to be treated by means of heating lamps disposed under said susceptor, said apparatus comprising:
   a gas entry preventive member for preventing process gas from being turned about a back surface of said susceptor, said gas entry preventive member being provided on a peripheral edge portion of said back surface of said susceptor, and said gas entry preventive member including a circular member having a predetermined length formed along said peripheral edge portion, and an outwardly bent shoulder provided on said circular member; and
   a heat insulating member supporting said susceptor, said heat insulating member including a first heat insulating member which is brought into linear contact with an upper surface of said bent shoulder and a second heat insulating member which is brought into linear contact with a lower surface of said bent shoulder, whereby a radiating heat quantity conducted from said susceptor toward said heat insulting members can be suppressed so as to enhance a heat retaining property.

9. The single wafer heat treatment apparatus according to claim 8, wherein an inert gas supply means for supplying an inert gas is provided in order to prevent process gas from turning about said back surface of said susceptor.

10. The single wafer heat treatment apparatus according to claim 8, further comprising support convex portions on said susceptor, said support convex portions coming into direct contact with a peripheral edge portion of the back of said object to be treated to space the back surface of said object to be treated apart by a slight clearance from the upper surface of said susceptor.

11. The single wafer heat treatment apparatus according to claim 10, wherein said support convex portions are arranged in plural number in a circumferential direction of said susceptor.

* * * * *